(12) United States Patent
Ring et al.

(10) Patent No.: US 11,450,778 B2
(45) Date of Patent: Sep. 20, 2022

(54) AG-DOPED PHOTOVOLTAIC DEVICES AND METHOD OF MAKING

(71) Applicant: First Solar, Inc., Tempe, AZ (US)

(72) Inventors: Kenneth Ring, Perrysburg, OH (US); William H. Huber, Perrysburg, OH (US); Hongying Peng, Perrysburg, OH (US); Markus Gloeckler, Perrysburg, OH (US); Gopal Mor, Perrysburg, OH (US); Feng Liao, Perrysburg, OH (US); Zhibo Zhao, Perrysburg, OH (US); Andrei Los, Perrysburg, OH (US)

(73) Assignee: First Solar, Inc., Tempe, AZ (US)

( * ) Notice: Subject to any disclaimer, the term of this patent is extended or adjusted under 35 U.S.C. 154(b) by 17 days.

(21) Appl. No.: 16/305,455

(22) PCT Filed: May 31, 2017

(86) PCT No.: PCT/US2017/035185
§ 371 (c)(1),
(2) Date: Nov. 29, 2018

(87) PCT Pub. No.: WO2017/210280
PCT Pub. Date: Dec. 7, 2017

(65) Prior Publication Data
US 2019/0363201 A1 Nov. 28, 2019

Related U.S. Application Data

(60) Provisional application No. 62/343,397, filed on May 31, 2016.

(51) Int. Cl.
*H01L 31/0296* (2006.01)
*H01L 31/073* (2012.01)
*H01L 31/18* (2006.01)

(52) U.S. Cl.
CPC ............ *H01L 31/02963* (2013.01); *H01L 31/02966* (2013.01); *H01L 31/073* (2013.01); *H01L 31/1832* (2013.01)

(58) Field of Classification Search
CPC .......... H01L 31/02963; H01L 31/0296; H01L 31/02966; H01L 31/03925
See application file for complete search history.

(56) References Cited

U.S. PATENT DOCUMENTS

| | | | | |
|---|---|---|---|---|
| 2010/0055826 | A1* | 3/2010 | Zhong | C23C 14/086 438/84 |
| 2012/0042950 | A1* | 2/2012 | Chin | H01L 31/073 136/260 |

(Continued)

FOREIGN PATENT DOCUMENTS

| | | |
|---|---|---|
| CN | 103003959 A | 3/2013 |
| CN | 103827976 A | 5/2014 |

(Continued)

OTHER PUBLICATIONS

Gretener Christina et al., "CdTe thin films doped by Cu and Ag—a comparison in substrate configuration solar cells" Jun. 8, 2014 (Jun. 8, 2014), 2014 IEEE 40th Photovoltaic Specialist Conference (PVSC), IEEE, pp. 3510-3514.

(Continued)

*Primary Examiner* — Eric R Smith
(74) *Attorney, Agent, or Firm* — MacMillan, Sobanski & Todd, LLC

(57) ABSTRACT

A doped photovoltaic device is presented. The photovoltaic device includes a semiconductor absorber layer or stack disposed between a front contact and a back contact. The absorber layer comprises cadmium, selenium, and tellurium doped with Ag, and optionally with Cu. The Ag dopant may be added to the absorber in amounts ranging from $5 \times 10^{15}/cm^3$ to $2.5 \times 10^{17}/cm^3$ via any of several methods of appli- (Continued)

cation before, during, or after deposition of the absorber layer. The photovoltaic device has improved Fill Factor and $P_{MAX}$ at higher $P_r(=I_{sc}*V_{oc}$ product) values, e.g. about 160 W, which results in improved conversion efficiency compared to a device not doped with Ag. Improved PT may result from increased $I_{sc}$, increased $V_{oc}$, or both.

10 Claims, 3 Drawing Sheets

(56) References Cited

U.S. PATENT DOCUMENTS

| | | | |
|---|---|---|---|
| 2013/0087744 | A1 | 4/2013 | Fujdala et al. |
| 2013/0112273 | A1 | 5/2013 | Negami et al. |
| 2013/0174895 | A1* | 7/2013 | Compaan ........ H01L 31/022425 136/255 |
| 2014/0060635 | A1 | 3/2014 | Foust et al. |
| 2014/0134786 | A1* | 5/2014 | Gessert ............. H01L 21/0237 438/95 |
| 2014/0216550 | A1 | 8/2014 | Damjanovic et al. |
| 2014/0326315 | A1* | 11/2014 | Blaydes ............. H01L 31/0272 136/260 |
| 2016/0027954 | A1 | 1/2016 | Cheng et al. |
| 2016/0126395 | A1 | 5/2016 | Damjanovic et al. |

FOREIGN PATENT DOCUMENTS

| | | | | |
|---|---|---|---|---|
| EP | 0244963 | A2 * | 11/1987 | ............... C25D 9/08 |
| EP | 1388597 | A1 | 2/2004 | |
| JP | S63213973 | A | 9/1988 | |
| JP | J08130321 | A | 5/1996 | |
| JP | 2001044457 | A * | 2/2001 | ........... H01L 31/046 |
| JP | 2002241452 | A | 8/2002 | |
| JP | 2003137700 | A | 5/2003 | |
| WO | WO-0109959 | A1 * | 2/2001 | ........... H01L 31/046 |
| WO | 2014165225 | A1 | 10/2014 | |

OTHER PUBLICATIONS

International Search Report and The Written Opinion, Application No. PCT/US2017/035185, dated Oct. 12, 2017.
Japanese Office Action, Application No. 2018-563492, dated Jul. 10, 2019.
Partial European Search Report, dated Mar. 23, 2020, European patent application 20154558.9.
Extended European Search Report, dated Jun. 26, 2020, Application No. 20154558.9.
Chinese Office Action, dated Oct. 8, 2021, Application No. 201780047535.6.
Gretener, "Back contact, doping and stability of CdTe thin film solar cells in substrate configuration", Research Collection, Doctoral Thesis, ETH Zurich, Diss. Eth No. 22751, 2015, pp. 1-144, Switzerland.
Intellectual Property Corporation of Malaysia, Substantive Examination Report, dated Aug. 24, 2021, Application No. PI 2018002075, Malaysia.
Intellectual Property Office of Vietnam, Substantive Examination Report, dated Jul. 28, 2021, Application No. 1-2018-05930, Vietnam.
Australian Office Action, dated Feb. 17, 2021, Application No. 2017273524.
Government of India, Examination Report, dated Apr. 15, 2021, Application No. 201817044223.
Japanese Office Action, dated Mar. 17, 2021, Application No. 2020-017719.

* cited by examiner

AG-DOPED PHOTOVOLTAIC DEVICES AND METHOD OF MAKING

This is a national phase application of international application PCT/US17/35185, filed under the authority of the Patent Cooperation Treaty on May 31, 2017, published; which claims priority to U.S. Provisional Application No. 62/343,397, filed under 35 U.S.C. § 111(b) on May 31, 2016.

BACKGROUND

The invention generally relates to photovoltaic devices. More particularly, the invention relates to photovoltaic devices including II-VI semiconductors such as cadmium, zinc, tellurium, and selenium, and to methods of making the photovoltaic devices.

Thin film solar cells or photovoltaic (PV) devices typically include a front contact, a back contact, and a plurality of semiconductor layers disposed on a transparent substrate. The semiconductor layers typically form a semiconductor stack layer that forms a p-n junction that drives an electrical current as photons are absorbed within the materials that make up the p-n junction. A p-n junction may be a "homojunction," which is made of the same composition with dopants added to create the n- or p-type regions; or a "heterojunction" which is made of dissimilar materials having, or being doped to have, p- or n-type properties. Thus, a p-n junction may be formed by a bilayer where the first layer has n-type properties, sometimes referred to as the window layer, and where the second layer has p-type properties, sometimes referred to as the absorber layer. If present, a window layer allows the penetration of solar radiation to reach into the absorber layer, where the energy from the solar radiation is converted to electrical energy by disassociating electrons from their nuclei in the absorber material.

The power output (P) of a PV device is the product of the current (I) and voltage (V) as shown by an IV curve, which is represented in FIG. 1. Along the x-axis at zero current or "open circuit," a maximum voltage is produced ($V_{OC}$) and along the y-axis at zero voltage or "short circuit," a maximum current is produced ($I_{SC}$). The product of these is the total potential power ($P_T$), given in watts (W), but this is not achievable in reality. The maximum power output ($P_{MAX}$) achievable is defined by the point on the IV curve that gives the largest product, I*V, which is shown on the axes in FIG. 1 as $I_{MP}$ and $V_{MP}$. Fill Factor (FF) is defined as the ratio of $P_{MAX}$ to $P_T$, i.e. the product of $I_{MP}*V_{MP}$ divided by the product of $I_{SC}*V_{OC}$, as shown in EQ1:

$$FF = \frac{P_{MAX}}{P_T} = \frac{I_{MP} \times V_{MP}}{I_{SC} \times V_{OC}} \quad \text{EQ 1}$$

Referring to FIG. 1, $P_{MAX}$ and $P_T$ may be thought of graphically as the area of the rectangles from the origin to $P_{MAX}$ and $P_T$ respectively, and FF is the ratio of the two areas. The more "squared off" the IV curve is (i.e. rectangular), the higher the FF and the more efficient the cell. The conversion efficiency of a PV device is a function of the total potential power ($P_T$) discounted by FF as a fraction of the incident power ($P_{INCIDENT}$), and may be represented mathematically as:

$$\text{Efficiency} = P_{MAX}/P_{INCIDENT} = (I_{SC}*V_{OC}*FF)/P_{INCIDENT} \quad \text{EQ 2}$$

One of the main objectives in the field of photovoltaic devices is the improvement of conversion efficiency. Increasing the sulfur or selenium content within an absorber consisting primarily of CdTe is known to decrease the band gap energy, which improves the infra-red absorption and leads to increased $I_{SC}$. Additionally, increasing grain size and/or thickness of a CdTe absorber layer has been shown to increase $V_{OC}$. While each of these singly and in combination should theoretically lead to higher $P_T=(I_{SC}*V_{OC})$ product, applicants' experience has shown that, at the desirable high-value range of ($I_{SC}*V_{OC}$) product values (i.e. at higher $P_T$), FF tends to drop off rapidly, thereby resulting in reduced overall conversion efficiency of the device.

Thus, there remains a need for improved thin film photovoltaic devices, configurations, and methods of manufacturing these.

BRIEF DESCRIPTION OF THE DRAWINGS

These and other features, aspects, and advantages of the present invention will become better understood when the following detailed description is read with reference to the accompanying drawings, wherein.

DETAILED DESCRIPTION

Figure 1:
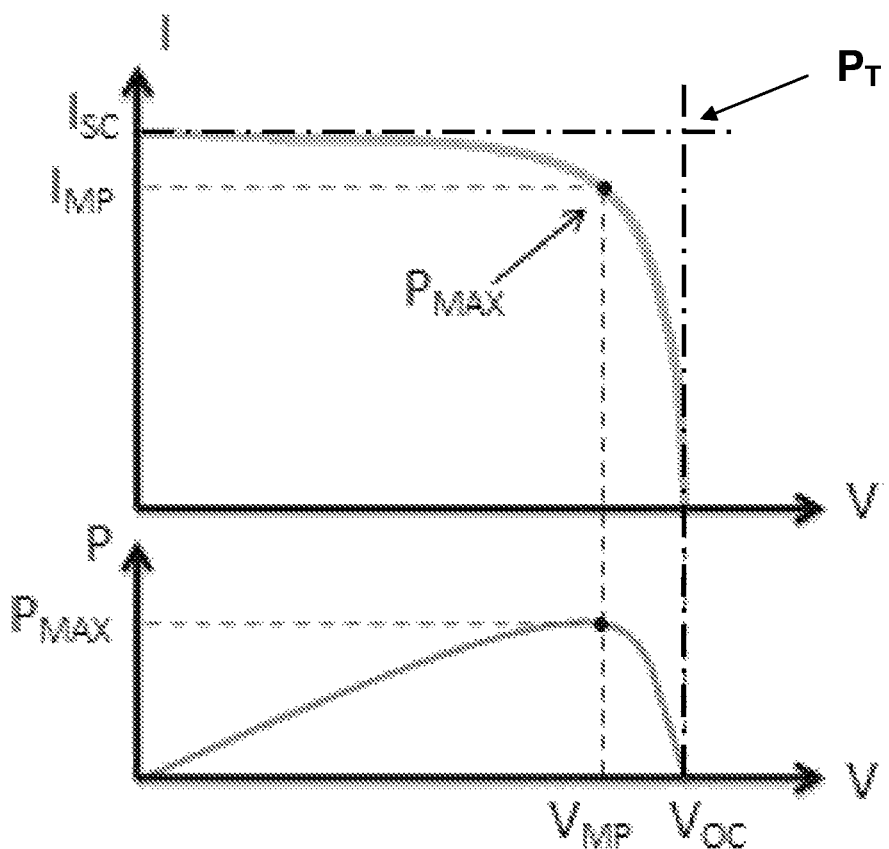
FIG. 1 is a schematic, representative IV curve showing the relationships of current and voltage to $P_{MAX}$ and $P_T$ and the Fill Factor.

Cadmium Telluride/Cadmium Sulfide (CdTe/CdS) heterojunction-based PV cells are one example of a thin film heterojunction solar cell. Such cells can include CdTe absorbers doped with Cu to improve carrier density. Other Group IB elements, notably Ag or Au, can be used as alternative dopants in CdTe absorbers. Doping with Cu and Ag used together as co-dopants in specific proportions, as described herein, can result in conversion efficiency benefits. For example, some embodiments achieve higher $V_{OC}$ and/or $I_{SC}$—and thus a higher potential total power, $P_T$—without a corresponding drop in FF and without a corresponding loss in overall conversion efficiency.

As discussed in detail below, some of the embodiments of the present disclosure include photovoltaic devices including II-VI semiconductors such as cadmium, zinc, sulfur, selenium, and tellurium. These semiconductors form lattice structures such that the Group II elements (Cd, Zn) are approximately equal to the Group VI elements (S, Se, Te).

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

In the following specification and the claims, the singular forms "a", "an" and "the" include plural referents unless the context clearly dictates otherwise. As used herein, the term "or" is not meant to be exclusive and refers to at least one of the referenced components (for example, a layer) being present and includes instances in which a combination of the referenced components may be present, unless the context clearly dictates otherwise.

The terms "transparent region" and "transparent layer" as used herein, refer to a region or a layer that allows an average transmission of at least 70% of incident electromagnetic radiation having a wavelength in a range from about 350 nm to about 1000 nm.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise.

As used herein, the term "disposed on" refers to layers disposed directly in contact with each other or indirectly by having intervening layers there between, unless otherwise specifically indicated. The term "adjacent" as used herein means that the two layers are disposed contiguously and are in direct contact with each other.

In the present disclosure, when a layer is being described as "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated.

The term "atomic concentration" as used herein with respect to a given named atom (e.g. Se or Ag) refers to the average number of such atoms per unit volume of a given layer. The terms "atomic concentration" and "concentration" are used herein interchangeably throughout the text. The term "varies across the thickness" as used herein with respect to a given named atom (e.g. Se or Ag) means that the concentration of such atom changes across the thickness of the absorber layer in a continuous or a non-continuous manner.

In one aspect, the invention relates to photovoltaic device having a front contact on the light incident side, a back contact and a substrate, the device comprising:

an absorber layer formed between the front contact and the back contact, the absorber layer having a thickness and a first interface with an adjacent layer towards the front contact and a second interface with an adjacent layer towards the back contact, the absorber layer comprising a II-VI semiconductor material comprising cadmium, selenium, and tellurium; wherein the absorber layer is doped with Ag.

Regarding this aspect, in some embodiments, the absorber may comprise a graded level of selenium, such that it is higher at the first interface than at the second interface; in some embodiments the absorber may be doped with both Cu and Ag, such that the copper dopant may range from about $5 \times 10^{15}/cm^3$ to about $1 \times 10^{18}/cm^3$, for example from about $5 \times 10^{16}/cm^3$ to about $5 \times 10^{17}/cm^3$, while the amount of silver dopant may range from about $1 \times 10^{15}/cm^3$ to about $5 \times 10^{17}/cm^3$, for example from about $5 \times 10^{15}/cm^3$ to about $2.5 \times 10^{17}/cm^3$; in some embodiments, the Ag dopant may be delivered to the absorber from a layer deposited as a back contact, for example a $Cd_yZn_{1-y}Te$:Ag, where y may vary from 0 to about 0.6.

In another aspect, the invention relates to a method of doping a photovoltaic device, comprising; forming an absorber layer over a substrate, the absorber comprising a II-VI semiconductor material; forming a back contact on the absorber layer, the back contact comprising Ag metal or Ag-containing alloy, and thermally processing the device to cause diffusion of the Ag into the absorber layer as a Ag dopant. Regarding this aspect, the II-VI semiconductor material may or may not contain Se, and it may or may not also be doped with Cu.

In another aspect, the invention relates to a photovoltaic device having a front contact on the light incident side, a back contact and a substrate, the device comprising:

an absorber layer formed between the front contact and the back contact, the absorber layer having a thickness and a first interface with an adjacent layer towards the front contact and a second interface with an adjacent layer towards the back contact, the absorber layer comprising a II-VI semiconductor material comprising cadmium, selenium, and tellurium; wherein the absorber layer is doped with Cu at a concentration of from about $5 \times 10^{16}/cm^3$ to about $5 \times 10^{17}/cm^3$, and wherein the absorber layer is also doped with Ag at a concentration of from about $5 \times 10^{15}/cm^3$ to about $2.5 \times 10^{17}/cm^3$.

Regarding this aspect, the Cu and Ag dopants may be placed in the absorber layer via any known method, including any of those those described herein. The relative amount—or ratio—of Cu dopant to Ag dopant in the absorber layer is from about 1 to about 50.

PV Devices and Methods of Forming

Photovoltaic devices generally comprise multiple layers of material disposed on a substrate. The critical layers include a semiconductor absorber for converting photon energy to electrical current, and front and back contacts that collect and conduct the generated current to or from the device. A p-n junction is typically formed either within the absorber layer (a "homojunction"), or between the absorber and an additional different layer (a "heterojunction"), usually called a window layer, but may also be a buffer or interfacial layer. Many other layers may optionally be present to improve the performance of the device.

Figure 2:
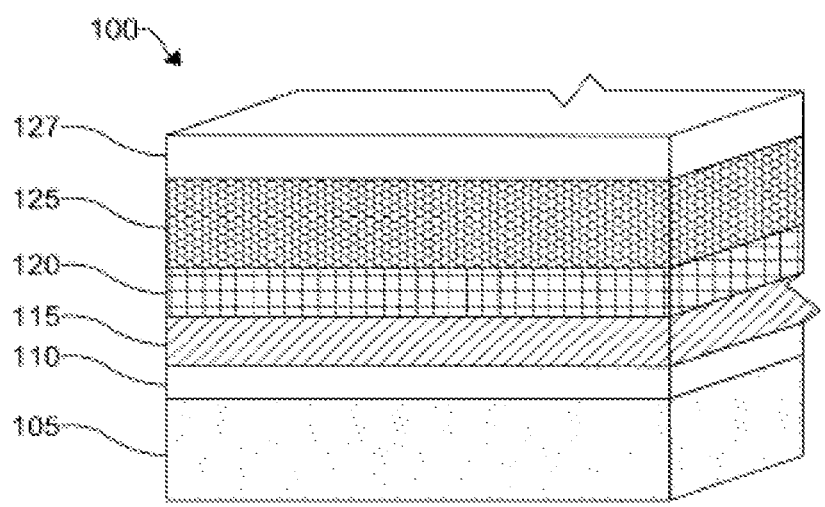
FIG. 2 is a representation of an exemplary embodiment of a PV device.

FIG. 2 depicts a photovoltaic device 100 according to the present disclosure wherein a number of layers are shown generally and described herein. The layers that are described herein, the materials used to form the layers, and/or the methods of forming the layers of the photovoltaic device 100 may be substituted, included in addition to layers described, or be absent in the embodiments of the invention described herein below and illustrated in the figures.

The photovoltaic device 100 may include a substrate layer 105, a transparent conductive oxide (TCO) layer 110 as front contact, an optional window layer 115 (i.e., in some embodiments the window layer 115 is omitted), an absorber layer 120 or stack which may be single or multi-layered, a back contact 125, and a back metal electrode 127. The photovoltaic device 100 may further include an interfacial layer, such as a buffer layer, for example, between the various layers of the device. In some embodiments, the buffer layer can be positioned between the window layer 115 and the absorber layer 120. Alternatively, the buffer layer can replace the window layer 115, i.e., the buffer layer can be positioned between the TCO layer 110 and the absorber layer 120. Photovoltaic devices may further include electrical connections, not shown, that provide a current path to communicate generated current flow, such as from one photovoltaic cell to adjacent cells in a module or from one photovoltaic module to adjacent modules in an array. Alternatively, the electrical connections may communicate the current flow to an external load device where the photogenerated current provides power.

Each of the layers of the photovoltaic device 100 and the devices described herein may be deposited by a sputtering or deposition process. In general, sputtering involves the ejectment of atoms from the surface of a target material via energetic bombardment of ions on the surface of the target. Alternatively, the layers may be formed by any other suitable deposition process known in the art, including, but not limited to, pulse laser deposition (PLD), chemical vapor deposition (CVD), electrochemical deposition (ECD), atomic layer deposition (ALD), evaporation, close space sublimation (CSS), or vapor transport deposition (VTD). It is further understood that each of the layers may be deposited in a single layer deposition from a single material, from a multi-layer deposition from a single material, or from a multi-layer deposition from a plurality of materials, as desired.

Each layer can cover all or a portion of the device and/or all or a portion of the layer or material underlying the layer. For example, a "layer" can mean any amount of material that contacts all or a portion of a surface. During a process to form one of the layers, the created layer forms on an outer surface, typically a top surface, of a substrate or substrate structure. A substrate structure may include a substrate layer introduced into a deposition process and any other or additional layers that may have been deposited onto the substrate layer in a prior deposition process. Layers may be deposited over the entirety of a substrate with certain portions of the material later removed through laser ablation, scribing, or other material-removal process.

The substrate layer 105 may be formed from glass, for example, soda lime glass or float glass. Alternatively, the substrate layer 105 may be formed from polymeric, ceramic, or other materials that provide a suitable structure for forming a base of a photovoltaic cell. The substrate layer 105 may have additional layers applied that promote the transmission of photons through its thickness, which may include anti-reflective coatings or anti-soiling coatings.

In some embodiments, the substrate 105 is transparent over the range of wavelengths for which transmission is desired. In one embodiment, the substrate 105 may be transparent to visible light having a wavelength in a range from about 350 nm to about 1000 nm. In some embodiments, the substrate 105 includes a material capable of withstanding heat treatment temperatures greater than about 600° C., such as, for example, silica or borosilicate glass. In some other embodiments, the support 111 includes a material that has a softening temperature lower than 600° C., such as, for example, soda-lime glass or a polyimide. The substrate layer 105 has the TCO layer 110 deposited thereon.

The TCO layer 110 may be formed from any suitable transparent conductive oxide, including, but not limited to, indium gallium oxide, cadmium stannate, cadmium tin oxide, silicon oxide, tin oxide, cadmium indium oxide, fluorine doped tin oxide, aluminum doped zinc oxide, indium tin oxide, or various combinations of the foregoing.

The term "transparent conductive oxide layer" as used herein refers to a substantially transparent layer capable of functioning as a front current collector. In some embodiments, the TCO layer 110 includes a transparent conductive oxide (TCO). Non-limiting examples of TCO's include cadmium tin oxide ($Cd_2SnO_4$ or CTO); indium tin oxide (ITO); fluorine-doped tin oxide (SnO:F or FTO); indium-doped cadmium-oxide; doped zinc oxide (ZnO), such as aluminum-doped zinc-oxide (ZnO:Al or AZO), indium-zinc oxide (IZO), and zinc tin oxide ($ZnSnO_x$); or combinations thereof. Depending on the specific TCO employed and on its sheet resistance, the thickness of the TCO layer 110 may be in a range of from about 50 nm to about 600 nm, in one embodiment.

The term "buffer layer" as used herein refers to an optional layer interposed between the transparent conductive oxide layer 110 and the absorber layer 120. Generally, the buffer layer has a higher sheet resistance than the sheet resistance of the TCO layer 110. The buffer layer is sometimes referred to in the art as a "high-resistivity transparent conductive oxide layer" or "HRT layer". The optional buffer layer may be formed from semiconductor materials such as, for example, tin oxide, zinc magnesium oxide, cadmium, cadmium tin oxide, zinc tin oxide, cadmium oxide, zinc aluminum oxide, zinc silicon oxide, a zinc zirconium oxide, tin aluminum oxide, tin silicon oxide, tin zirconium oxide, or another suitable wide-band gap and stable material.

The window layer 115, if present, is formed on the TCO layer 110 and may be formed from a semiconductor material such as, for example, CdS, CdSSe, CdSe, zinc sulfide (ZnS), a ZnS/CdS alloy, ZnSO, zinc magnesium oxide, cadmium magnesium sulfide, cadmium tin oxide, zinc tin oxide, cadmium oxide, zinc aluminum oxide, zinc silicon oxide, a zinc zirconium oxide, tin aluminum oxide, tin silicon oxide, tin zirconium oxide, or another suitable wide-band gap and stable material. This optional layer may be n-type as deposited or may become n-type after complete processing of the device structure. It is understood that a buffer layer may be formed between the window layer 115 and the TCO layer 110. It is understood that the photovoltaic device 100 may omit the window layer 115, as desired.

The absorber layer 120 is formed on the window layer 115 when present or on the TCO or buffer layer if no window layer 115 is present. The absorber layer 120 may be formed from any II-VI semiconductor material, generally binary, ternary, quaternary, or more complex alloys of the form (Cd, Zn)(S, Se, Te) where the atomic sum of Group II elements is approximately equal to the atomic sum of Group VI elements. Exemplary such II-VI semiconductor compounds include: cadmium telluride (CdTe), cadmium zinc telluride, cadmium selenide (CdSe), cadmium sulfotelluride (CdSTe) cadmium selenium telluride (CdSeTe), for example, $CdSe_xTe_{1-x}$ where x is from about 1 at % to about 40 at %, and combinations and alloys of any of the foregoing II-VI semiconductors. The addition of S or Se to a CdTe absorber layer has been shown to lower the band gap of the CdTe material and extend the wavelength of light that might be absorbed and converted to energy, thereby increasing the current produced. For example, $CdSe_xTe_{1-x}$ with 0% Se (x=0) has a band gap of about 1.5 eV, whereas with 40% Se (x=0.4), the band gap is about 1.39 eV.

Figure 3:
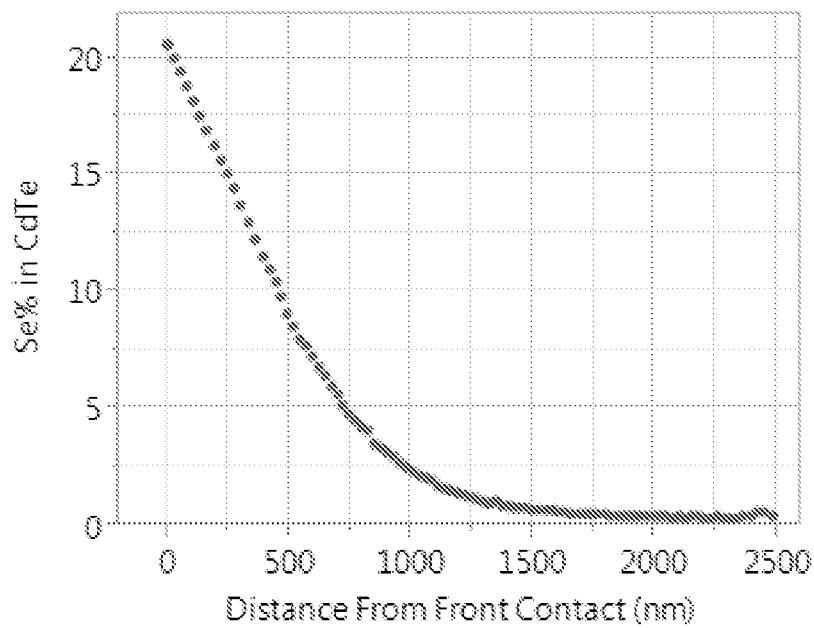
FIG. 3 is a representative Se profile in a graduated ternary absorber.

The absorber layer 120 may be formed from a single deposited layer, or from multiple layers of differing materials that form a binary, ternary, or quaternary alloy that recrystallizes during thermal processing. The composition is changed during the annealing process following the deposition, and optimization of the deposition and annealing allows the optimization of the desired profile. With ternary and higher alloys, at least one element may optionally form a gradient across the absorber layer 120 once the multiple layers are annealed, such that the concentration of that element (e.g. Se or S) varies across the thickness of the absorber layer 120. Regardless of how the absorber layer 120 is formed, the absorber layer 120 is formed between the front contact and the back contact, and has a thickness between a first interface towards the front contact, which can be formed by the TCO layer 110, and a second interface towards the back contact 125. In some embodiments, the first interface can be adjacent with an adjacent layer towards the front contact, and the second interface can be adjacent with an adjacent layer towards the back contact 125. In one embodiment, a ternary alloy absorber is formed of cadmium, selenium, and tellurium such that the concentration of Se at the first interface is higher than the concentration of Se at the second interface. For example, the absorber layer may contain $CdSe_xTe_{1-x}$ where x is from about 1 at % to about 40 at %, but x may be in the range from about 10 at % to about 40 at % at the first interface and from about 1 at % to about 20 at % at the second interface. FIG. 3 illustrates such a profile of graduated Se content, where Se content is about 20 at % at the first interface and decreases gradually to near zero at the second interface.

Many other specific configurations of absorber layers and methods of depositing them are disclosed in co-owned U.S. application Ser. No. 14/531,425, published as US 2016/0126395, on May 5, 2016 and incorporated herein by reference. For example, on at least one embodiment, the graduated Se content in the absorber layer is achieved by deposition of a one or more first layers comprising CdSe, deposition of one or more second layers comprising CdTe, and thermally processing the layers to diffuse Se into the second layers. Alternatively, a layer having graduated Se profile like that represented in FIG. 3 may be formed by sequentially depositing multiple layers of $CdSe_xTe_{1-x}$ where x decreases in value for each of the sequentially formed layers. In some embodiments, the atomic concentration of selenium at the first interface exceeds the atomic concentration of selenium at the second interface by at least 10 fold, for example 20 fold, 40 fold, 80 fold, 100 fold or more.

In certain embodiments, the concentration of selenium varies continuously across the thickness of the absorber layer 120. Further, in such instances, the variation in the selenium concentration may be monotonic or non-monotonic. In some instances, the rate-of-change in concentration may itself vary through the thickness, for example, increasing in some regions of the thickness, and decreasing in other regions of the thickness. Moreover, in some instances, the selenium concentration may remain substantially constant for some portion of the thickness. The term "substantially constant" as used in this context means that the change in concentration is less than 5 percent across that portion of the thickness.

In other embodiments, there is less gradual, more pronounced step-change in the concentration of selenium across the thickness of the absorber layer.

The back contact 125 is an interfacial layer between the absorber layer 120 and the back metal electrode 127. The combination of the back contact 125 and the back metal electrode 127 may collectively be referred to generally as the back contact without a distinction being drawn between the layers. The back contact 125 may be formed from any material including tellurium, selenium, gold, tungsten, tantalum, titanium, palladium, nickel, silver, calcium, lead, mercury, graphite, and the like. In some embodiments, the back contact 125 may be formed of a zinc telluride alloy of the form $Cd_yZn_{1-y}Te:D$, where y may vary from 0 to about 0.6, and D represents an optional dopant. This general formula thus includes the following exemplary back contact compounds: ZnTe, ZnTe:Cu, ZnTe:Ag, ZnTe:Au, $Cd_yZn_{1-y}Te:Cu$, $Cd_yZn_{1-y}Te:Ag$, $Cd_yZn_{1-y}Te:Au$, where y is defined above. In some embodiments y may range from about 0.3 to about 0.6, for example from 0.45 to about 0.55. In some other embodiments, the back contact may be formed of indium nitride, HgTe, Te, and PbTe, or any other suitable material. Dopants, D, and the concentrations at which they may be used are described below.

The back metal electrode 127 provides lateral conduction of electricity to the outside circuit. The back metal electrode 127 may be formed from aluminum, copper, nickel, gold, silver, molybdenum nitride, molybdenum, chromium, oxidized metals, nitrides metals, combinations of the foregoing, alloys of the foregoing, or any other metals known to be useful as a conductor in a photovoltaic device. A suitable back contact 125 and back metal electrode 127 is described in the commonly-owned patent application WO2014/151610 for Photovoltaic Device Having Improved Back Electrode and Method of Formation, hereby incorporated herein by reference in its entirety, the disclosure of which may be relied upon for enablement with respect to the back contact 125 and back metal electrode 127 portion of the present disclosure.

If an interfacial layer is present in the photovoltaic device 100, the interfacial layer may be formed from any number of materials and may be disposed between any of the various layers of the photovoltaic device, as desired. The interfacial layer may be a buffer layer or a barrier layer that inhibits the diffusion of chemical ions from, into, or across the substrate 105 or another layer of the device 100. For example, one interfacial layer included in the photovoltaic device 100 may be a barrier layer formed between the substrate layer 105 and the TCO layer 110. The barrier layer may be formed from any suitable material, including, but not limited to, silica, alumina, tin oxide, or silicon aluminum oxide. Another example of an interfacial layer may be a buffer layer formed between the TCO layer 110 and the window layer 115 to reduce recombination of holes and electrons at the interface of the TCO layer 110 and the window layer 115. The buffer layer may be formed of any suitable material, including, but not limited to, tin oxide, zinc oxide, zinc tin oxide, zinc doped tin oxide, indium oxide, a mixture of tin and zinc oxides, zinc stannate, zinc magnesium oxide, zinc oxysulfide, cadmium manganese sulfide, or cadmium magnesium sulfide, or combinations of the foregoing, for example.

The photovoltaic device 100 may include other components such as, bus bars, external wiring, laser etches, etc. For example, when the device 100 forms a photovoltaic cell of a photovoltaic module, a plurality of photovoltaic cells may be connected in series in order to achieve a desired voltage, such as through an electrical wiring connection. Each end of the series connected cells may be attached to a suitable conductor such as a wire or bus bar, to direct the generated current to convenient locations for connection to a device or other system using the generated current. In some embodiments, a laser may be used to scribe the deposited layers of the photovoltaic device 100 to divide the device into a plurality of series connected cells.

In some embodiments, other components (not shown) may be included in the exemplary photovoltaic device 100, such as, buss bars or tapes, junction boxes, external wiring, laser scribes, encapsulants, etc. For example, when the device 100 forms a photovoltaic cell of a photovoltaic module, a plurality of photovoltaic cells may be connected in series in order to achieve a desired voltage, such as through an electrical wiring connection. Each end of the series connected cells may be attached to a suitable conductor such as a wire or bus bar, to direct the generated current to convenient locations for connection to a device or other system using the generated current. In monolithic thin film embodiments, a laser may be used to scribe the deposited layers of the photovoltaic device 100 to divide the device into a plurality of series-connected cells.

Dopants and Doping Methods

Undoped CdTe is considered intrinsic with a carrier density or concentration of about $1 \times 10^{10}/cm^3$. In order to increase the carrier density and/or to modify a layer or region to be more p-type or more n-type, a dopant may be added. Dopants, D, may be added before, during, or after deposition of a layer and may increase the charge carrier density several orders of magnitude. Although the boundaries are not rigid, a material is generally considered p-type if electron acceptor carriers are present in the range of about $1 \times 10^{11}/cm^3$ to about $1 \times 10^{17}/cm^3$, and p+-type if acceptor carrier density is greater than about $1 \times 10^{17}/cm^3$. Similarly, a material is considered n-type if electron donor carriers are present in the range of about $1 \times 10^{11}/cm^3$ to about $1 \times 10^{17}/cm^3$, and n+-type if donor carrier density is greater than about $1 \times 10^{17}/cm^3$.

Suitable acceptor dopants that can make a II-VI semiconductor like CdTe more p-type include: (i) those that replace Cd in the CdTe lattice including, but not limited to: Li, Na, K, Rb (referred to herein as Group IA dopants), and Cu, Ag, and Au (referred to herein as Group IB dopants); and (ii) those that replace Te in the CdTe lattice including, but not limited to: V, Nb, and Ta (referred to herein as Group VB dopants) and N, P, As, Sb, and Bi (referred to herein as Group VA dopants). Suitable donor dopants that can make a II-VI semiconductor like CdTe more n-type include: (i) those that replace Cd in the CdTe lattice including, but not limited to: Sc, Y, and La (referred to herein as Group IIIB dopants), and B, Al, Ga, and In (referred to herein as Group IIIA dopants); and (ii) those that replace Te in the CdTe lattice including, but not limited to: Mn, Tc (referred to herein as Group VIIB dopants), and F, Cl, Br, and I (referred to herein as Group VIIA dopants).

Copper is a Group IB dopant that can be used to make II-VI semiconductors like CdTe more p-type. Dopant Cu can be employed to create an ohmic contact between the absorber layer 120 and the back metal electrode 127, since few metals have a sufficiently high work function. In certain embodiments, the absorber layer 120 further includes a copper dopant, which may range from about $5 \times 10^{15}/cm^3$ to about $1 \times 10^{18}/cm^3$, for example from about $5 \times 10^{16}/cm^3$ to about $5 \times 10^{17}/cm^3$. In some embodiments, the concentration of Cu in the absorber is higher at the second interface than at the first interface. In addition to copper (Cu), silver (Ag) and gold (Au) are known as Group IB dopants for CdTe semiconductors, and the literature suggests they are equivalent to Cu for this purpose.

In certain embodiments, the absorber layer 120 further includes a silver dopant, which may range from about $1 \times 10^{15}/cm^3$ to about $1 \times 10^{18}/cm^3$, for example from about $5 \times 10^{15}/cm^3$ to about $2.5 \times 10^{17}/cm^3$. Silver may be incorporated as a dopant in the absorber layer 120 using any of the methods described herein. Silver may be used as the sole dopant in II-VI semiconductors or as a supplemental dopant along with Cu. When Ag is used as a sole dopant in II-VI semiconductors, it was surprisingly found that less dopant is required Compared to the levels of Cu dopant. In some embodiments, 15% to 70% of the dopant levels are sufficient when Ag is substituted for Cu, for instance, from about 20% to about 60%. This may contribute to improved long term stability as shown by the accelerated stress data of FIG. 6 (described in Example 2, below). Similarly, in devices co-doped with both Cu and Ag, the amount of Cu may be reduced by a factor of 20% to 50%, thus reducing the amount of highly diffusible Cu.

As noted previously, the co-doping of a II-VI semiconductor with both Cu and Ag in proportions described herein has contributed to a significant advantage in conversion efficiency, discussed later. In such cases, the proportion of copper to silver dopants is such that the copper dopant may range from about $5 \times 10^{15}/cm^3$ to about $1 \times 10^{18}/cm^3$, for example from about $5 \times 10^{16}/cm^3$ to about $5 \times 10^{17}/cm^3$, while the amount of silver dopant may range from about $1 \times 10^{15}/cm^3$ to about $5 \times 10^{17}/cm^3$, for example from about $5 \times 10^{15}/cm^3$ to about $2.5 \times 10^{17}/cm^3$. Some embodiments with both Cu and Ag dopants exhibit a ratio of Cu to Ag from about 1:1 to about 50:1. For example, the ratio of Cu to Ag in the absorber layer 120 can be at least about 2:1 such as, for example, at least about 4:1 in one embodiment, at least about 3:1 in another embodiment. In other embodiments, the ratio of Cu to Ag in the absorber layer 120 can be up to about 40:1, up to about 30:1, or up to about 20:1. In bounded ranges, the ratio of Cu to Ag in the absorber layer 120 can be between about 5:1 and 40:1 in one embodiment, or between about 5:1 and 30:1 in another embodiment, or between about 10:1 and 20:1 in a further embodiment.

Dopants (e.g. Cu, Ag, Au) may be incorporated into the absorber layer 120 by several means. First, the source targets for vapor deposition or sputtering may include a dopant. Alternatively, multiple sources or targets—one containing the dopant and another containing the main absorber material—may be co-deposited or co-sputtered to incorporate a dopant. In another method, thin layers of pure dopant may be deposited as an interfacial layer on top of or prior to depositing the absorber layer 120, followed by a thermal processing that allows the dopant to diffuse from its layer into adjacent layers of the absorber. Additionally, dopants may be applied by "wet processes" that involve making solutions of dopant or dopant salts that may be sprayed or coated onto layer surfaces, either before or after deposition of the absorber layer 120, followed by a thermal processing that allows the dopant to diffuse from its wet solution into adjacent layers of the absorber layer 120. Dopants may also be applied in this manner by mixing the dopant solution with cadmium chloride and applying to the absorber layer prior to a heat treatment.

In at least one embodiment, a dopant is incorporated into the absorber layer as part of forming a back contact, or an interfacial layer between the absorber and back contact. As described previously, deposition of the back contact may include a dopant D, for example Cu, Au, or Ag in a II-VI semiconductor absorber such as CdTe, ZnTe, CdSeTe, or CdZnTe. In these embodiments, the back contact 125 or interfacial layer with dopant is deposited on the absorber layer 120, and thermally processed or annealed to permit diffusion of the dopant into the absorber layer 120. In one embodiment, the Ag may be included in a back contact material comprising $Cd_yZn_{1-y}Te$, where y is from 0 to about 0.6, for example from about 0.4 to about 0.6 or about 0.5.

When a dopant such as copper or silver is applied as its own layer either from solution or a metallic layer, it is sometimes more useful to characterize the dopant load or dose as mass/area covered. When the device 100 is thermally processed further, the dopant diffuses into the layer as described above. Copper dopant doses useful in the present disclosure expressed in this manner include from about 5 ng/cm$^2$ to about 70 ng/cm$^2$, for example from about 10 ng/cm$^2$ to about 50 ng/cm$^2$. Silver dopant doses useful in the invention expressed in this manner include from about 1 ng/cm$^2$ to about 30 ng/cm$^2$, for example from about 2 ng/cm$^2$ to about 20 ng/cm$^2$.

EXAMPLES AND IMPROVED EFFICIENCY PERFORMANCE

Example 1

Figure 4:
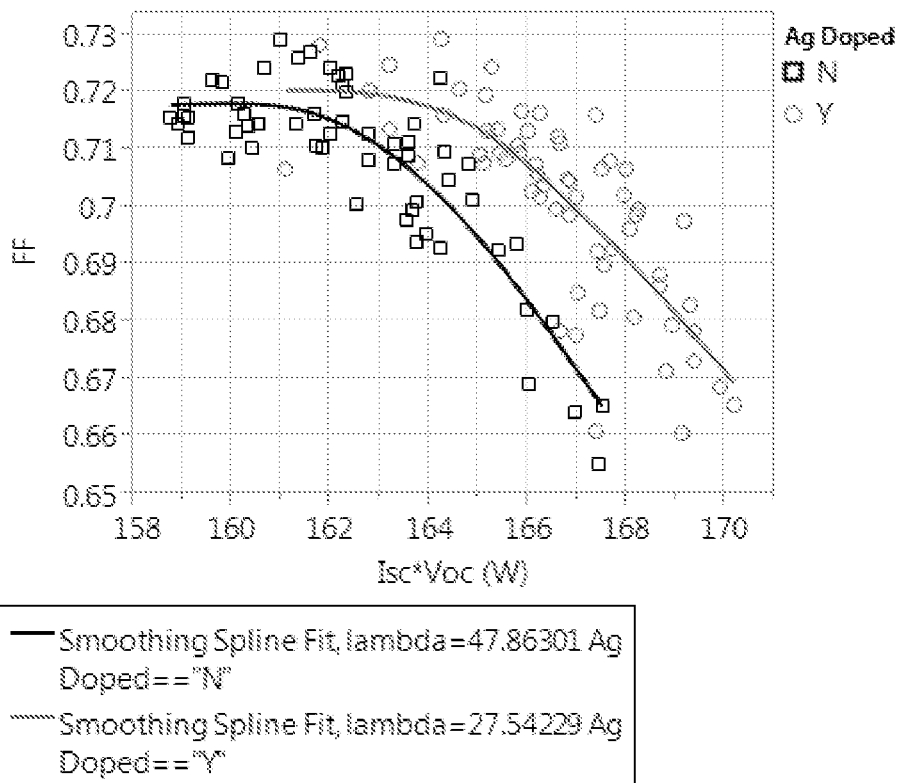
FIG. 4 is a graph of FF vs $P_T$ as explained in the description.
Figure 5:
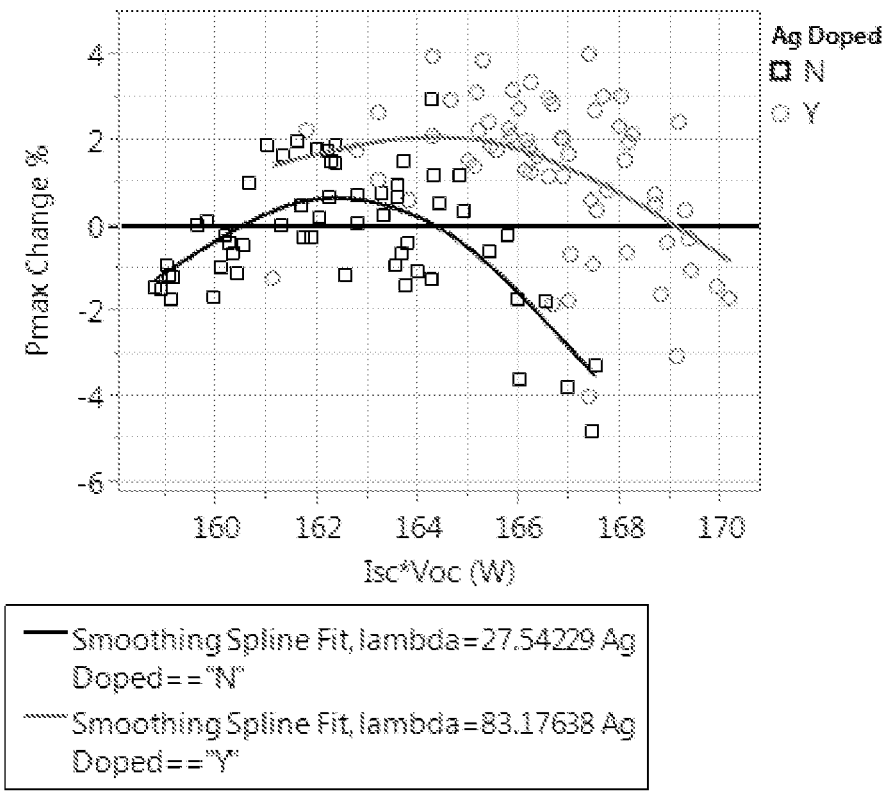
FIG. 5 is a graph of relative $P_{MAX}$ vs $P_T$ as explained in the description.

Comparative CdSeTe absorber PV devices were formed with Cu dopant at about $2\times10^{17}$/cm$^3$ in the absorber layer. Copper was provided by depositing a ZnTe:Cu layer on the absorber layer, followed by heat processing. Example CdSeTe PV devices were formed with Cu dopant at about $2\times10^{17}$/cm$^3$ and Ag dopant at about $1.5\times10^{16}$/cm$^3$ in the absorber layer. The silver was applied to the absorber layer as an aqueous solution of silver nitrate at a dose of about 2 ng/cm$^2$ and heated to anneal the layers and diffuse the Ag into the absorber. An I-V sweep curve was produced for both the comparative and example PV devices to obtain $I_{SC}$ and $V_{OC}$ values as shown in FIGS. 1 and 4. $P_{MAX}$, $P_T$, and FF are calculated from these and $P_{MAX}$ is plotted as a relative increase in FIG. 5. The zero-baseline in FIG. 5 is an arbitrary baseline for a specific thickness device, but the relative improvement of the example devices (circles) over the comparative devices (squares) is reflected here. At $P_T=I_{sc}*V_{OC}$ product (in watts, W) from about 161 W to about 168 W the $P_{MAX}$ is from about 1% to about 5% higher in the Ag-doped devices compared to the non-Ag doped devices, and the trend is towards greater improvement at the higher $P_T=I_{sc}*V_{OC}$ product region.

From the example described above, it is evident that the PV device having a silver dopant outperforms a comparative device having only a copper dopant. This is somewhat unexpected considering that the electron shell configurations are very similar (shells 3d/4d full with 10 electrons, and 1 electron only in the next s shell). Moreover, the literature also suggests the equivalency—not superiority—of Ag in place of Cu as a dopant in CdTe absorber solar cells. See, e.g. Gretener, et al, CdTe Thin Films doped by Cu and Ag—a Comparison in Substrate Configuration Solar Cells, (2014) 2014 IEEE 40th Photovoltaic Specialist Conference, PVSC 2014, art. no. 6925689, pp. 3510-3514; http://www.scopus.com/inward/record.url?eid=2-s2.0-84912074-574&partnerID=40&md5=0688dfb7339050b34e59c49b24-353000.

Applicants have found however, that improved efficiency performance comes in the form of greater $I_{SC}$, greater $V_{OC}$, or both, which produces a higher $P_T$ as shown in FIGS. 4 and 5. Although FF does decline at higher $P_T=I_{sc}*V_{OC}$ product, it does so at much higher $P_T=I_{sc}*V_{OC}$ product which converts to higher $P_{MAX}$ and higher conversion efficiency. By maintaining a higher FF at increasing $P_T$, a higher $P_{MAX}$ is attained. This is evident from FIG. 4, wherein the Ag-doped devices (circles) exhibit about 1 to about 3 percentage points higher FF at any given $P_T=I_{sc}*V_{OC}$ product that the non-silver doped devices (squares), and the effect is most pronounced at the highest $P_T$ values. By increasing FF while at any given $P_T$, a higher $P_{MAX}$ is attained.

As shown in FIGS. 4 and 5, the benefit of Ag co-doping increases as the "Isc*Voc" product increases. This $P_T$ ($=I_{sc}*V_{OC}$ product) value may be modulated to higher values by increasing the selenium content of the absorber to lower the band gap. This is an important development because now CdSeTe absorbers with higher selenium content may be used to maximize absorption of incident light, especially in the infrared range above about 800 nm. It has been determined that the absorption edge of such new absorbers may be pushed 1-10 nm, e.g. about 5 nm, further into the IR range.

Example 2

Figure 6:
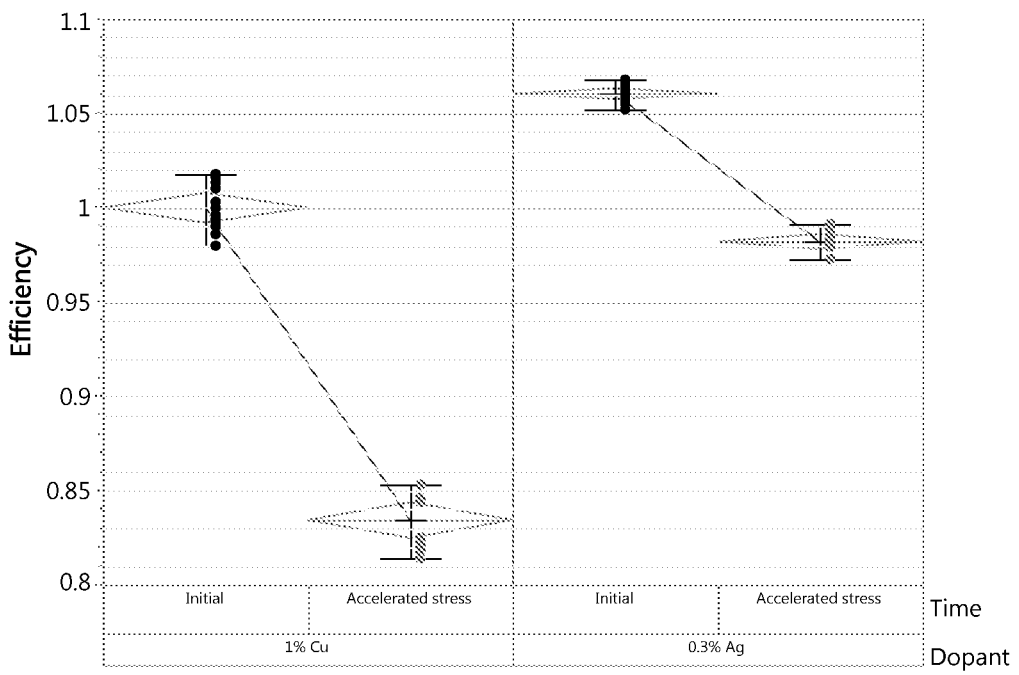
FIG. 6 is a graph showing stability improvement as explained in the description.

CdSeTe absorber PV devices were formed with dopant supplied by a sputtered back contact containing the dopant, followed by thermal processing. Comparative PV devices were formed with Cu dopant at 1.0% in the back contact sputter target to generate an estimated absorber concentration of about $2\times10^{17}$/cm$^3$ in the absorber layer. Example PV devices were formed with Ag dopant at 0.3% in the back contact sputter target. Conversion efficiency of the devices was measured at an initial time and again after an accelerated stress test designed to mimic long term usage. The data are shown in FIG. 6. Upon initial measurement, efficiency of the Ag devices (with about ⅓ the total dopant) was about 6% higher than the comparative Cu-doped devices, which has been normalized to a value of 1.0 in the Figure. Furthermore, after each was subjected to an accelerated stress test, the comparative Cu devices showed an efficiency deterioration of more than 15%, but the Ag-doped devices showed a deterioration of only about 8%. Notably, the post-stress conversion efficiency of the Ag-doped devices was within a few % of the initial (un-stressed) efficiency of the Cu-doped devices.

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:
1. A photovoltaic device comprising:
    an absorber layer that converts photon energy to electrical current, wherein:
        the absorber layer comprises a II-VI semiconductor material comprising cadmium, selenium, and tellurium;
        the absorber layer is doped with copper and silver at a ratio of copper to silver greater than 2:1, and a back contact comprising ZnTe directly on the absorber layer.
2. The photovoltaic device of claim 1, wherein the ratio of copper to silver is between 5:1 and 40:1.

3. The photovoltaic device of claim 1, wherein the absorber layer is doped with copper at a concentration between $5\times10^{16}$/cm$^3$ and $5\times10^{17}$/cm$^3$.

4. The photovoltaic device of claim 1, wherein the absorber layer is doped with silver at a concentration between $5\times10^{15}$/cm$^3$ and $2.5\times10^{17}$/cm$^3$.

5. The photovoltaic device of claim 1, wherein the back contact is doped with Ag.

6. The photovoltaic device of claim 5, comprising a front contact on a light incident side, wherein:
   the absorber layer has a thickness between a first interface towards the front contact and a second interface towards the back contact;
   a concentration of selenium varies throughout the thickness of the absorber layer from a highest level at the first interface and a lowest level at the second interface.

7. The photovoltaic device of claim 6, wherein the absorber layer includes CdSe$_x$Te$_{1-x}$ with x from about 1 at % to about 40 at %.

8. The photovoltaic device of claim 7, wherein x is from about 10 at % to about 40 at % at the first interface and from about 0 at % to about 20 at % at the second interface.

9. A photovoltaic device having a front contact on a light incident side, a back contact, and a substrate, the photovoltaic device comprising:
   an absorber layer formed between the front contact and the back contact, the absorber layer having a thickness and a first interface towards the front contact, and a second interface contacting the back contact, the absorber layer comprising a II-VI semiconductor material comprising cadmium, selenium, and tellurium;
   wherein the absorber layer is doped with copper and silver, wherein a ratio of copper to silver in the absorber layer is between 3:1 and 30:1, wherein the back contact comprises ZnTe.

10. The photovoltaic device of claim 9, wherein:
   the silver dopant is present in the absorber layer in a concentration from about $5\times10^{15}$ atoms/cm$^3$ to about $2.5\times10^{17}$ atoms/cm$^3$; and
   the copper dopant is present in the absorber layer in a concentration from about $5\times10^{16}$ atoms/cm$^3$ to about $5\times10^{17}$ atoms/cm$^3$.

* * * * *